United States Patent
Liu

(12) 
(10) Patent No.: US 6,245,683 B1
(45) Date of Patent: Jun. 12, 2001

(54) STRESS RELIEVE PATTERN FOR DAMASCENE PROCESS

(75) Inventor: Chin-Kai Liu, Taichung (TW)

(73) Assignee: Taiwan Semiconductor Manufacturing Company, Hsin-Chu (TW)

(*) Notice: Subject to any disclaimer, the term of this patent is extended or adjusted under 35 U.S.C. 154(b) by 0 days.

(21) Appl. No.: 09/473,028

(22) Filed: Dec. 28, 1999

(51) Int. Cl.$^7$ .................................................. H01L 21/311
(52) U.S. Cl. ........................ 438/702; 438/723; 438/724; 438/958
(58) Field of Search .................. 438/706, 712, 438/714, 723, 724, 958, 700, 702

(56) References Cited

U.S. PATENT DOCUMENTS

| | | | |
|---|---|---|---|
| 5,225,372 | * 7/1993 | Savkar et al. | 437/190 |
| 5,494,853 | 2/1996 | Lur | 437/195 |
| 5,554,418 | 9/1996 | Ito et al. | 427/579 |
| 5,753,967 | 5/1998 | Lin | 257/635 |
| 5,780,351 | * 7/1998 | Arita et al. | 438/396 |
| 5,821,174 | 10/1998 | Hong et al. | 438/788 |
| 5,834,365 | 11/1998 | Ming-Tsung et al. | 438/612 |
| 5,916,823 | 6/1999 | Lou et al. | 438/738 |
| 5,924,006 | 7/1999 | Lur et al. | 438/626 |
| 5,939,335 | * 8/1999 | Arndt et al. | 438/696 |
| 5,943,599 | 8/1999 | Yao et al. | 438/623 |
| 5,946,542 | * 8/1999 | Iyer | 438/7 |
| 6,077,789 | * 6/2000 | Huang | 438/720 |
| 6,107,188 | * 8/2000 | Liu et al. | 438/633 |

* cited by examiner

*Primary Examiner*—Benjamin L. Utech
*Assistant Examiner*—Kin-Chan Chen
(74) *Attorney, Agent, or Firm*—George O. Saile; Stephen B. Ackerman

(57) ABSTRACT

A new method is provided for the creation of interfacing and adjacent surfaces when creating damascene interconnects. Under the first embodiment of the invention, the surface area of the Intra Metal Dielectric (IMD) in which the copper metal pattern has been created is partially removed thereby reducing and sub-dividing the surface area of the interfacing surface. Under the second embodiment of the invention, the surface area of the IMD is sub-divided into a multiplicity of squares that now form the interfacing surface area. Under the third embodiment of the invention, the surface area of the Intra Metal Dielectric (IMD) in which the copper metal pattern has been created is essentially removed leaving sidewalls of the IMD material on the formed pattern of copper interconnects.

30 Claims, 4 Drawing Sheets

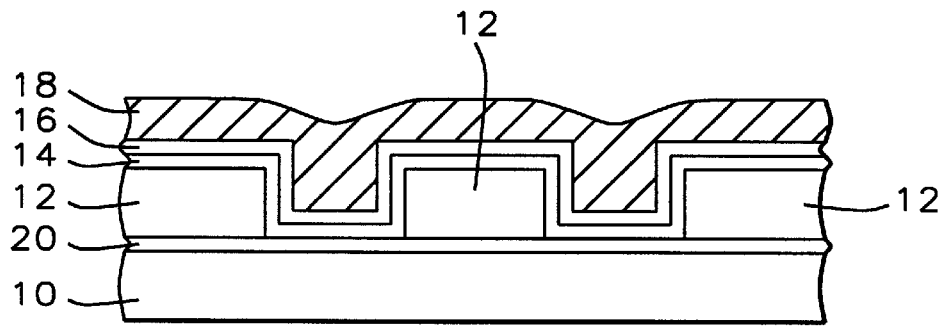
FIG. 1 – Prior Art
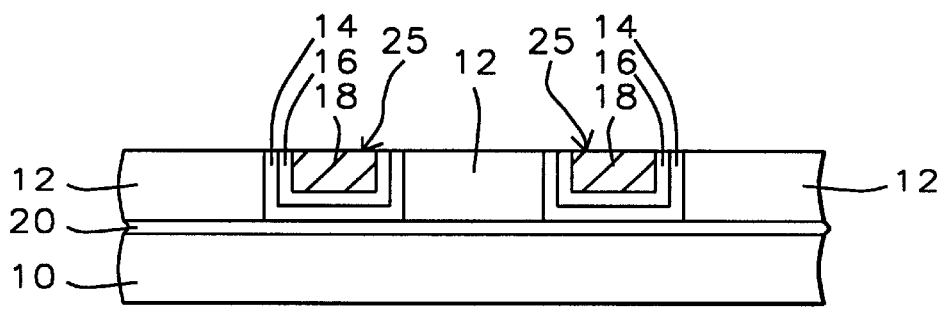
FIG. 2 – Prior Art
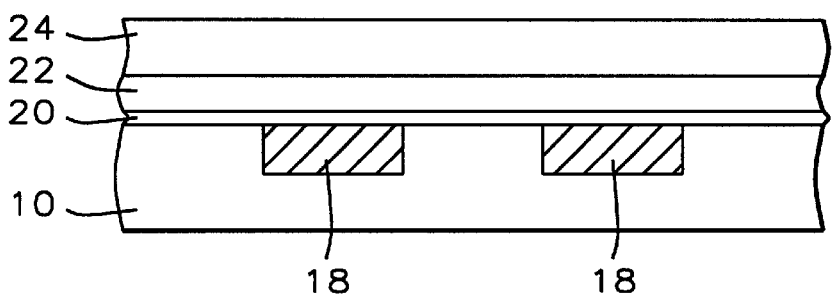
FIG. 3 – Prior Art

STRESS RELIEVE PATTERN FOR DAMASCENE PROCESS

BACKGROUND OF THE INVENTION

(1) Field of the Invention

The invention relates to the fabrication of integrated circuit devices and, more particularly, to a method of creating damascene patterns that are essentially stress free.

(2) Description of the Prior Art

One of the more important aspects of the formation of semiconductor devices is the interconnection of devices and device features, this aspect of semiconductor design has gained increased importance with the continued decrease in device feature sizes and device dimensions. Not only is device geometry an important parameter in the design of device interconnects, the materials that form these interconnects and the interfacing of these materials with adjoining layers are of equal importance.

Two widely used approaches in creating metal interconnects are the use of the damascene and the dual damascene structures. The application of the damascene process continues to gain wider acceptance, most notably in the process of copper metalization due to the difficulty of copper dry etch where the damascene plug penetrates deep in very small, sub-half micron, Ultra Large Scale Integrated (ULSI) devices. Recent applications have successfully used copper as a conducting metal line, most notably in the construction of CMOS 6-layer copper metal devices.

In the formation of a damascene structure, a metal plug is first formed in a surface; this surface in most instances is the surface of a semiconductor substrate. A layer of Intra Level Dielectric (ILD) is deposited (using for instance Plasma Enhanced CVD technology with $SiO_2$ as a dielectric) over the surface into which trenches for metal lines are formed (using for instance Reactive Ion Etching technology).

The trenches overlay the metal plug and are filled with metal (using for instance either the CVD or a metal flow process). Planarization of this metal to the top surface of the layer of ILD completes the damascene structure. Some early damascene structures have been achieved using Reactive Ion Etching (RIE) for the process of planarization but Chemical Mechanical Planarization (CMP) is used exclusively today.

An extension of the damascene process is the dual damascene process whereby an insulating or dielectric material, such as silicon oxide, is patterned with several thousand openings for the conductive lines and vias, which are filled at the same time with metal. Damascene is an interconnection fabrication process in which grooves are formed in an insulating layer and filled with metal to form the conductive lines. Dual damascene is a multi-level interconnection process in which, in-addition to forming the grooves of single damascene, conductive via openings also are formed. One of the dual damascene approaches uses a dielectric layer that is formed by three consecutive depositions whereby the central layer functions as an etch stop layer. This etch stop layer can be SiN, the top and bottom layer of this three layer configuration can be $SiO_2$. This triple layer dielectric allows first forming the vias by resist patterning the vias and etching through the three layers of dielectric. The conductive pattern can then be formed in the top layer of dielectric whereby the central layer of SiN forms the stop layer for the etch of the conducting pattern. Another approach, still using the three-layer dielectric formed on the substrate surface, is to first form the pattern for the conducting lines in the top layer of the dielectric, whereby the SiN layer again serves as etch stop. The vias can then be formed by aligning the via pattern with the pattern of the conducting lines and patterning and etching the vias through the etch stop layer of SiN and the first layer of dielectric. Yet another approach is to deposit the three layer dielectric in two steps, first depositing the first layer of $SiO_2$ and the etch stop layer of SiN. At this point the via pattern can be exposed and etched. The top layer of $SiO_2$ dielectric is then deposited; the conducting lines are now patterned and etched. The SiN layer will stop the etching except where the via openings have already been etched.

Dual damascene is an improvement over single damascene because it permits the filling of both the conductive grooves and vias with metal at the same time, thereby eliminating process steps.

In the formation of semiconductor integrated circuits, it is common practice to form interconnect metal line structures on a number of different levels within the structure and interconnecting the various levels of wiring with contact or via openings. The first or lowest level of interconnect wires is typically formed as a first step in the process after which a second or overlying level of interconnect wires is deposited over the first level. The first level of interconnect wires is typically in contact with active regions in a semiconductor substrate but is not limited to such contact. The first level of interconnect can for instance also be in contact with a conductor that leads to other devices that form part of a larger, multi-chip structure. The two levels of metal wires are connected by openings between the two layers that are filled with metal where the openings between the two layers are lined up with and match contact points in one or both of the levels of metal lines.

Previously used techniques to form multi-levels of wiring apply the technique of first forming the interconnect level metal in a first plane followed by forming the overlying level of interconnect wire in a second plane. This structure typically starts with the surface of a semiconductor substrate into which active devices have been created. These active devices can include bipolar transistors, MOSFET devices, doped regions that interconnect with other regions of the device while provisions may also have been provided to make interconnects with I/O terminals in the periphery of the device. The surface into which the pattern of interconnect lines of the first plane is formed may also be an insulation layer deposited over the surface of the substrate or a layer of oxide may first have been formed on the surface of the substrate. After the layer, into which the pattern of interconnecting wires has to be created, has been defined, the interconnecting pattern itself needs to be defined. This is done using conventional photolithographic techniques whereby the openings are made (in the layer) above the points that need to be contacted in the substrate. The openings, once created, may by lined with layers of material to enhance metal adhesion (to the sidewalls of the opening), the glue layer, or to prevent diffusion of materials into and from the substrate in subsequent processing steps, the barrier layer. For the barrier layer, a variety of materials can be used such as Ti/Tin:W (titanium/titanium nitride:tungsten), titanium-tungsten/titanium or titanium-tungsten nitride/titanium or titanium nitride or titanium nitride/titanium, silicon nitride ($Si_3N_4$), tungsten, tantalum, niobium, molybdenum. The final phase in creating the first level of interconnect lines is to fill the created openings with metal, typically aluminum, tungsten or copper, dependent on the particular application and requirements and restrictions imposed by such parameters as line width, aspect ratio of the opening, required planarity of the surface of the deposited metal and others.

This process of line formation in overlying layers on metal can be repeated in essentially the same manner as just highlighted for the first layer of interconnecting wires. This process of forming sequential layers of interconnecting levels of wire is in many instances prone to problems and limitations. Copper has in recent times found more application in the use of metal wires due to its low resistivity, high electromigration resistance and stress voiding resistance. Copper however exhibits the disadvantage of high diffusivity in common insulating materials such as silicon dioxide and oxygen-containing polymers. This leads to, for instance, the diffusion of copper into polyimide during high temperature processing of the polyimide resulting in severe erosion of the copper and the polyimide due to the copper combining with oxygen in the polyimide. The erosion may result in loss of adhesion, delamination, voids, and ultimately a catastrophic failure of the component. The copper that is used in an interconnect may diffuse into the silicon dioxide layer causing the dielectric strength to become conductive and also decreasing the dielectric strength of the silicon dioxide layer. A copper diffusion barrier is therefore often required; silicon nitride is often applied as a diffusion barrier to copper. Silicon nitride however has a dielectric constant that is high compared to silicon dioxide thereby limiting the use of silicon nitride in encapsulating copper interconnect lines.

In addition, due to the fact that copper is very difficult to process by RIE, the CMP method may need to be used where copper is used as a wiring material. To polish copper at a high rate without scratching in accordance with the buried wiring formation, the copper etch rate must be raised by increasing the amount of the component responsible for copper etching contained in the polishing slurry. If the component is used in an increased amount, the etching will occur isotropically. Consequently, buried copper is etched away, causing dishing in the wiring. It is, when forming interconnect lines using copper, desirable to use methods that do not depend on patterning the copper lines using a chemical etching process since etching of copper is very difficult and is a process that is only recently being further investigated. The use of copper as a metal for interconnect wiring is further hindered by copper's susceptibility to oxidation. Conventional photoresist processing cannot be used when the copper is to be patterned into various wire shapes because the photoresist needs to be removed at the end of the process by heating it in a highly oxidized environment, such as an oxygen plasma, thereby converting it to an easily removed ash.

For a damascene structure where copper is used as the metal and Ta and/or Ta compounds are used for the barrier layer, the dishing of the surface of large trenches and the erosion that occurs on the surface of small structures is, after CMP of the copper surface, very severe due to the extreme difference in polishing rate between copper and Ta-based materials. Ta-based materials have a low chemical mechanical polishing rate due to their hard and chemically inert nature whereas copper has a high chemical mechanical polishing rate due to its soft nature. It is therefore clear that, where copper and Ta-based materials are polished in proximity to each other and as part of the same polishing process, the surfaces of these two material will be affected or polished in an unequal manner resulting in dishing and erosion of the polished copper surface.

The planarization of copper surfaces that use CMP techniques results in copper surfaces of excellent planarity. This excellent planarity however makes adherence by overlying layers, such as passivation layers that contain oxides and nitrides, very difficult and causes relatively large stress in these overlying layers. This poor adhesion and large stress causes the overlying layer to readily peel during thermal cycles of the substrate caused by the different coefficients of thermal expansion of the interfacing surfaces. The invention addresses this problem by teaching a method that eliminates the presence of relatively large, very flat surfaces during the formation of damascene interconnects. The stress that typically exists in overlying layers will be reduced thereby reducing peeling of overlying layers and removing a potential yield detractor.

FIG. 1 shows a cross section of a typical formation of interconnect metal lines. A stop layer 20 (typically of SiN) has been deposited over the surface 10, which is typically the surface of a monocrystalline silicon substrate. The stop layer functions as the etch stop for the etching of the layer 12 of IMD. A layer 12 of Intra Metal Dielectric (IMD) is deposited over the surface of stop layer 20. Layer 12 of IMD is preferably formed of plasma oxide or LPCVD oxide material and specifically has a thickness of between 5000 and 15000 angstrom and more preferably about 15000 angstrom.

The layer 12 of IMD is patterned whereby the IMD is removed from the regions within the layer of IMD where the metal 18 for the pattern of interconnect lines is to be deposited. Standard photolithography and RIE procedures, using $CF_4/CHF_3$ as etchant gas, can be used to create the trenches for the metal pattern in the layer 12 of dielectric.

Before the metal 18 is deposited, a barrier layer 14 and seed layer 16 are frequently deposited over the surface of the patterned layer 12 of IMD and along the walls and over the bottom of the openings that been created in the layer 12 of IMD for the metal interconnect lines.

FIG. 2 shows a cross section of the prior art after the layer 18 of copper has been planarized essentially down to the surface of the layer 12 of IMD. The sidewalls and bottom of the metal pattern 18 of FIG. 2 is surrounded by the barrier layer 14 and the seed layer 16. The planarization of the layer of copper has resulted in a very smooth copper surface 25 that has excellent surface planarity. The smoothness of this surface 25 however results in the previously highlighted problems of lack of adhesion of overlying layers of passivation. It is this problem of the lack of adhesion between the copper surface 25 and the overlying passivation layer that the invention addresses.

FIG. 3 shows a cross section of the prior art where a passivation layer comprising layer 22, containing $SiO_x$, and layer 24, containing $Si_xN_y$, have been deposited over the surface of the IMD and the surface of the copper pattern 18.

U.S. Pat. No. 5,916,823 (Lou et al.) and U.S. Pat. No. 5,753,967 (Lin) show a dual damascene processes with spacers.

U.S. Pat. No. 5,834,365 (Ming-Tsung et al.) shows a bond pad with dummy lines thereunder to improve adhesion. This is close to the invention's (second) embodiment U.S. Pat. No. 5,554,418 (Ito et al.) and U.S. Pat. No. 5,821,174 (Hong et al.) and U.S. Pat. No. 5,943,599 (Yao et al.) show processes for forming a passivation layer over a line.

U.S. Pat. No. 5,494,853 (Lur) and U.S. Pat. No. 5,924,006 (Lur et al.) shows a process for forming metal lines under a passivation layer. However, this reference differs from the invention.

SUMMARY OF THE INVENTION

A principle objective of the invention is to prevent peeling of overlying layers during the creation of damascene metal interconnects.

Another objective of the invention is to provide a method for creating planes that provide improved adhesion to overlying layers.

Yet another objective of the invention is to provide active components for adhesion between adjacent surfaces.

A still further objective of the invention is to prevent stress between adjacent surfaces.

A still further objective of the invention is to reduce the impact of yield detractors that are caused by planes of extreme planarity.

In accordance with the objectives of the invention a new method is provided for the creation of interfacing and adjacent surfaces when creating damascene interconnects. Under the first embodiment of the invention, the surface area of the Intra Metal Dielectric (IMD) in which the copper metal pattern has been created is partially removed thereby reducing and sub-dividing the surface area of the interfacing surface. Under the second embodiment of the invention, the surface area of the IMD is sub-divided into a multiplicity of squares that now form the interfacing surface area. Under the third embodiment of the invention, the surface area of the Intra Metal Dielectric (IMD) in which the copper metal pattern has been created is essentially removed leaving sidewalls of the IMD material on the formed pattern of copper interconnects.

BRIEF DESCRIPTION OF THE DRAWINGS

FIG. 1 shows a cross section of a Prior Art method of forming copper interconnect lines, after the deposition of an overlying layer of copper.

FIG. 2 shows a cross section of the Prior Art method, after the deposited layer of copper has been planarized.

FIG. 3 shows a cross section of the Prior Art method, after a passivation layer has been deposited.

FIG. 4 and FIG. 5 address the first embodiment of the invention, whereby:

FIG. 5 shows the cross section of FIG. 4 after a passivation layer has been deposited over the surface of the copper interconnects and the reduced surface area of the IMD.

FIG. 6 shows a top view of the results that are achieved under the second embodiment of the invention.

FIG. 7 shows a cross section of the results that are achieved under the second embodiment of the invention.

FIG. 8 shows a cross section of one of the initial processing steps of the third embodiment of the invention that contains a stop layer overlying the copper pattern and the layer of IMD.

FIG. 9 shows a cross section of the results that are obtained under the third embodiment of the invention after the stop layer has been etched.

FIG. 10 shows a cross section of the results that are obtained under the third embodiment of the invention after the surface of the IMD has been etched leaving the sidewalls of the copper patterns covered with IMD material.

FIG. 11 shows a cross section of the results that are obtained under the third embodiment of the invention after the deposition of the passivation layer has been completed.

DESCRIPTION OF THE PREFERRED EMBODIMENTS

Typical passivating layers can contain silicon oxide/ silicon nitride ($SiO_2/Si_3N_4$) deposited by CVD, SACVD oxide layer, plasma enhanced nitride layer, LPCVD oxide, photosensitive polyimide and titanium nitride. Another material often used for passivation layer is phosphorous doped silicon dioxide that is typically deposited over a final layer of aluminum interconnect using a Low Temperature CVD process. Typical processing conditions of the formation of passivation layers using PECVD technology are a temperature between about 350 and 450 degrees C. with a pressure of between about 2.0 and 2.8 Torr for the duration between about 8 and 12 seconds. Etching of a passivation layer can for instance use $Ar/CF_4$ as an etchant at a temperature of between about 120 and 160 degrees C. and a pressure of between about 0.30 and 0.40 Torr for a time of between about 33 and 39 seconds using a dry etch process. Another example of etching of passivation layers uses $He/NF_3$ as an etchant at a temperature of between about 80 and 100 degrees C. and a pressure of between about 1.20 and 1.30 Torr for a time of between about 20 and 30 seconds using a dry etch process.

The method of the invention addresses the use of passivation layers that contain an oxide ($SiO_x$) and a nitride ($Si_xN_y$).

Figure 4A:
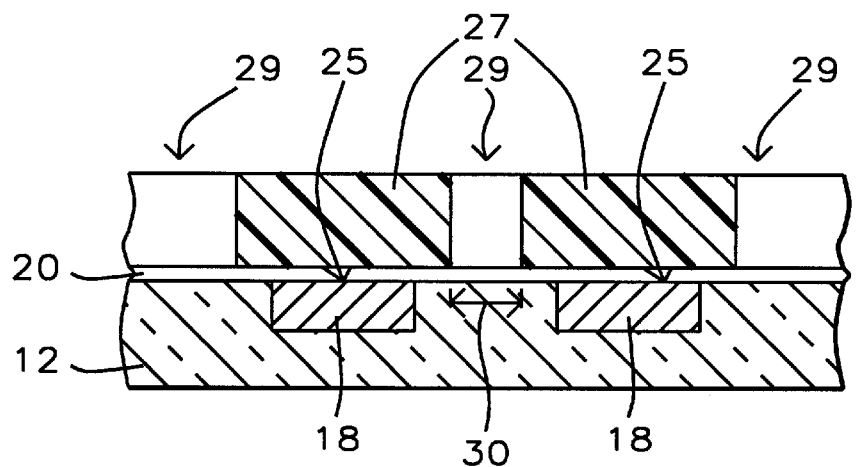
FIG. 4a shows a cross section whereby a layer of photoresist is deposited and patterned for partial removal of the layer of IMD.
Figure 4B:
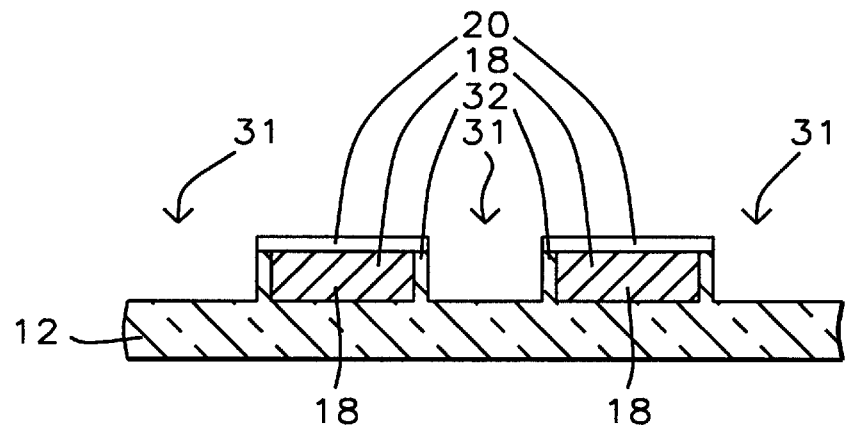
FIG. 4b shows a cross section whereby the surface of the IMD is partially removed from between the copper pattern.

Referring now specifically to FIG. 4a and 4b, there is shown a cross section that applies to the first embodiment of the invention whereby the surface of the IMD is partially removed from between the copper pattern. The inter metal dielectric (IMD). layer 12 is preferably formed of plasma oxide or LPCVD oxide material and specifically has a thickness of between 5000 and 15000 angstrom and more preferably about 15000 angstrom. The barrier layers and the seed layers that surround the copper pattern 18 have, for reasons of clarity, not been-shown in FIGS. 4a and 4b and in the following figures. The copper pattern 18 has been created in the IMD using conventional processes. The first embodiment of the invention therefore starts with a cross section of the copper interconnect lines that is identical to the Prior Art cross section that has been shown in FIG. 2. The surface 25 of FIG. 4a is highly planarized and typically shows lack of adhesion by overlying layers of passivation. A layer 27 of clear tone photoresist is deposited on top of the etch stop layer 20, this layer of photoresist is patterned-whereby openings 29 are created in the layer 27 of photoresist. The mask that has been used to form the trenches in the layer 12 of IMD is a dark tone mask. By using a clear tone mask for the exposure of the photoresist 27, the openings 29 that are created in this layer form the reverse pattern of the openings that have been created in the layer 12 of IMD. It must thereby however be noted that, although the openings for the copper pattern and the openings created in the layer of photoresist are essentially reverse type openings, these openings do not have the exact reverse apertures. That is the openings 29, that are created in the layer 27 of photoresist, are smaller than the distance across the surface of the layer 12 of IMD between the copper pattern 18 and have a diameter 30, whereby openings 29 are centered between and interstitial with the copper pattern 18. Openings 29 therefore expose most but not the entire surface of the layer 12 of IMD between the copper pattern 18. This partial exposure results in partial etching of the layer 12 of IMD, leaving columns 32 of IMD in place immediately adjacent to the copper pattern 18, see FIG. 4b. It is clear from FIG. 4b that most of the surface of the layer 12 of IMD has been removed, leaving this surface however essentially intact immediately adjacent to the copper pattern 18.

The layer 27 of photoresist can be deposited using conventional methods of spin-on, the thickness of the deposited layer 27 of photoresist is preferably between about 2000 and 6000 Angstrom. Layer 27 of photoresist can be etched by applying $O_2$ plasma and then wet stripping by using $H_2SO_4$, $H_2O_2$ and $NH_4OH$ solution. A photoresist developer often used during development of the photoresist is tetramethyl ammonium hydroxide (TMAH) which reduces metal-ion diffusion and contamination in other parts of the IC. Other developers such as sodium hydroxide, sodium metasillicide or potassium hydroxide may also be used.

Standard photolithography and RIE procedures, using $CF_4/CHF_3$ as etchant gas, are used to create the trenches in the layer 12 of IMD dielectric.

It is clear from the cross section that is shown in FIG. 4a and FIG. 4b that the surface 25 of the layer of IMD has been significantly altered and, in doing so, the reason for problems that are caused by extreme planarity of this surface have been eliminated. The etch of the layer 12 of IMD has created openings 31 in the layer 12 of IMD, these openings are interstitial with the copper pattern and essentially penetrate the layer 12 of IMD as deep as the height of the copper pattern 18.

Figure 5:
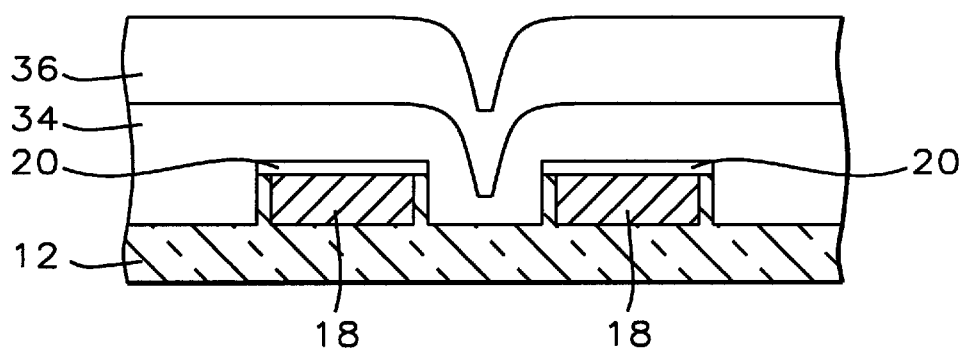

FIG. 5 shows a cross section of the results that are obtained under the first embodiment of the invention after the passivation layer 34/36 has been deposited over the surface of the layer 12 of IMD, thereby including the surface of stop layer 20 that remains in place over the surface of the copper pattern 18. The passivation layer comprises the layer 34 of silicon oxide and the layer 36 of silicon nitride. The deposited layers 34 and 36 have penetrated the openings 31 that have been etched in the IMD, these penetrations cause excellent adhesion between the passivation layer 34/36 and the underlying combination of copper pattern 18, layer 12 of IMD and the etch stop layer 20.

The layer 36 of silicon nitride ($Si_3N_4$) can be deposited using LPCVD or PECVD procedures at a pressure between about 300 mTorr and 400 mTorr, at a temperature between about 600 and 800 degrees C., to a thickness of between about 2000 and 5000 Angstrom using $NH_3$ and $SiH_4$. The silicon nitride layer 36 can also be deposited using LPCVD or PECVD procedures using a reactant gas mixture such as dichlorosilane ($SiCl_2H_2$) as a silicon source material and ammonia ($NH_3$) as a nitrogen source, at a temperature between about 600 and 800 degrees C., at a pressure between about 300 mTorr and 400 mTorr, to a thickness between about 2000 and 5000 Angstrom.

Layer 34 of silicon oxide ($SiO_x$) can be formed using monosilane ($SiH_4$) and nitrous oxide ($N_2O$) as a source material deposited using LPCVD or PECVD procedures, at a temperature between about 300 and 800 degrees C., to a thickness between about 2000 and 5000 Angstrom.

Figure 6:
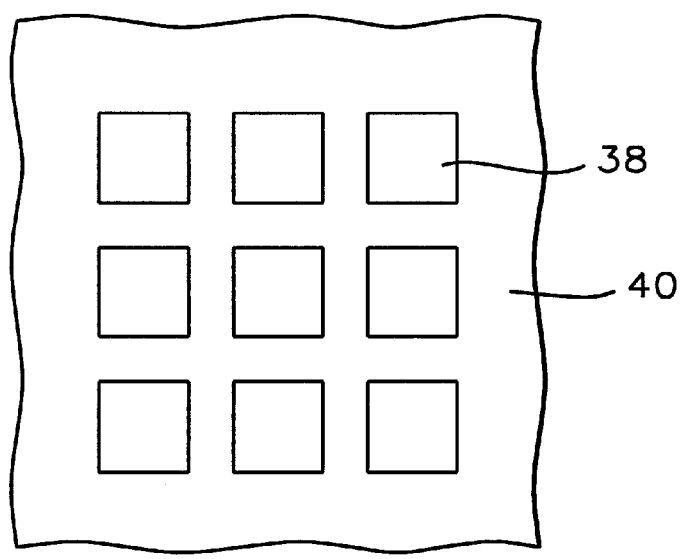
FIGS. 6 and 7 address the second embodiment of the invention, as follows.
Figure 7:
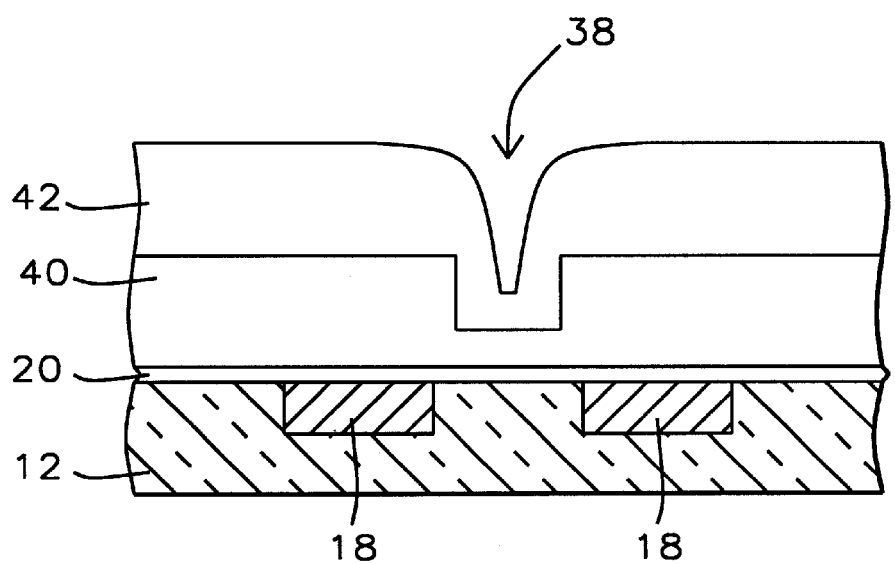

FIGS. 6 and 7 address the second embodiment of the invention. The second embodiment of the invention is fundamentally different from the first embodiment of the invention in that, under the second embodiment, the first layer of silicon oxide of the passivation layer is deposited over the surface of the planarized surface of the IMD including the copper pattern without processing this surface onto which the layer of silicon oxide is deposited. Under the second embodiment of the invention, the layer of silicon oxide itself is patterned and etched thereby forming an interstitial layer of the passivation that eliminates the effect of the highly planarized underlying surface 25. FIG. 6 shows a top view of the openings 38 that have been created in the surface of layer 40 of silicon oxide. These openings are not etched down to the surface of the stop layer 20 as is shown in the cross section of FIG. 7. Layer 40 of silicon oxide can contain monosilane ($SiH_4$) and nitrous oxide ($N_2O$) and can be deposited using LPCVD. or PECVD procedures, at a temperature between about 300 and 800 degrees C., to a thickness between about 1000 and 5000 Angstrom. Openings 38 in the layer 40 of silicon oxide can be formed via anisotropic RIE of said silicon oxide layer, using $CHF_3$ or $CF_4$—$O_2$—He as an etchant.

The opening 38 does not, as already stated, penetrate the layer 40 but is typically etched to a depth of between 2000 and 4000 Angstrom. The formation of silicon oxides films is typically performed by means of dry oxidation at high temperatures of 800 degrees C. or more, and by means of wet oxidation, in which hydrogen is caused to combust in an oxygen atmosphere at a temperature of 700 degrees C. or more, water vapor is generated, and oxidation occurs. The growth rate of the silicon oxide is relatively high in wet oxidation. Wet oxidation is therefore more effective in forming the silicon oxide layer 40 at low temperatures using conventional technology. Using wet oxidation, the temperature must necessarily be that of the combustion of hydrogen, 700 degrees C. or more, since wet oxidation requires the combustion of hydrogen. After the opening 38 has been etched, the layer 42 of silicon nitride ($Si_3N_4$) is deposited by CVD to a thickness of between about 2000 and 4000 Angstrom. It is clear from the cross section that is shown in FIG. 7 that the layer of passivation that comprises layers 40 and 42 is not the typical uniformly deposited passivation layer but contains two layers that are closely intertwined and that are therefore significantly better the withstand forces of stress and the therefrom following peeling of the passivation layer.

Figure 8:
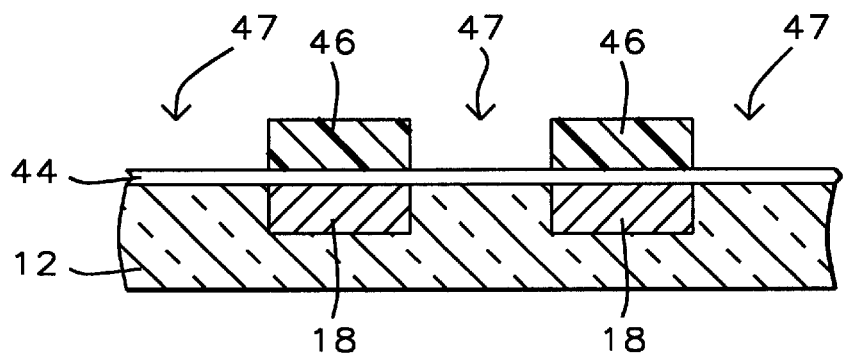
FIGS. 8 through 11 address the third embodiment of the invention, as follows.

FIGS. 8 through 11 address the third embodiment of the invention. Under the third embodiment of the invention, a stop layer 44, FIG. 8, is first deposited over the surface of the layer 12 of IMD including the surface of the copper interconnect pattern 18. This stop layer 44 is a stop layer for the etch of the overlying layer 46 of photoresist and can contain $Si_xN_y$ that is deposited using CVD to a thickness of between about 200 and 400 Angstrom. A layer 46 of photoresist is deposited over the surface of stop layer 44 using conventional methods of spin-on, the thickness of the deposited layer 46 of photoresist is preferably between about 2000 and 6000 Angstrom. Layer 46 of photoresist can be etched by applying $O_2$ plasma and then wet stripping by using $H_2SO_4$, $H_2O_2$ and $NH_4OH$ solution. A photoresist developer often used during development of the photoresist is tetramethyl ammonium hydroxide (TMAH) which reduces metal-ion diffusion and contamination in other parts of the IC. Other developers such as sodium hydroxide, sodium metasillicide or potassium hydroxide may also be used. The pattern in which the layer 46 of photoresist is etched is the inverse pattern of the etch for the trenches for the copper layer that has been performed in the layer 12 of IMD. The exposure for the etch of the photoresist is a clear tone exposure but in the third embodiment there is, as opposed to the first embodiment of the invention (FIG. 4a), no clearance or shift between the openings that are created in the layer 46 of photoresist and the surface of the IMD that present between the pattern of copper. The openings for the copper pattern and the openings created in the layer of photoresist are essentially reverse type openings and have the exact reverse apertures. Openings 47 therefore expose the surface of the layer 12 of IMD that is deposited between the copper pattern 18. This exposure results in etching of the stop layer 44 leaving the stop layer 44 in place above the copper pattern, FIG. 9.

The stop layer 44 can be etched using a SION or SiN removal process with etchant gasses $CH_3F/Ar/O_2$ at a temperature between about 10 and 20 degrees C., a pressure of between about 50 and 60 mTorr with an etch time of between about 40 and 60 seconds. The silicon nitride layer 44 can also be wet etched using a buffered oxide etchant (BOE). The BOE may comprise a mixed solution of fluoroammonium and fluorohydrogen (7:1) and phosphoric acid solution. The silicon nitride layer 44 can also be etched using anisotropic RIE using $CHF_3$ or $SF_6$—$O_2$ as an etchant. The silicon nitride layer 44 can also be dipped into phosphoric acid ($H_3PO_4$) to be removed.

Figure 9:
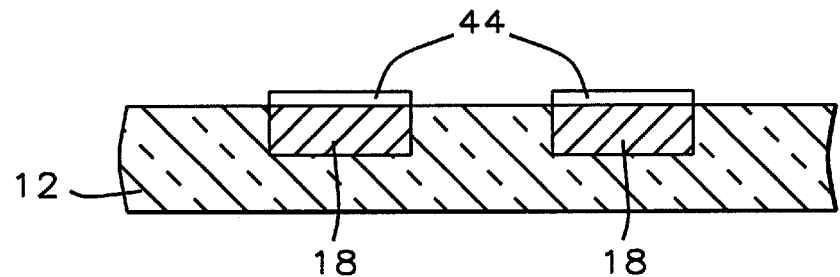

It is clear from FIG. 9 that the surface of the layer of IMD between the copper pattern 18 has been exposed making this surface accessible to further etching. The results of this etch of the layer 12 results in the cross section is shown in FIG. 10 where sidewall oxide remains in place in regions 48 that are immediately adjacent to the copper pattern 18.

Figure 10:
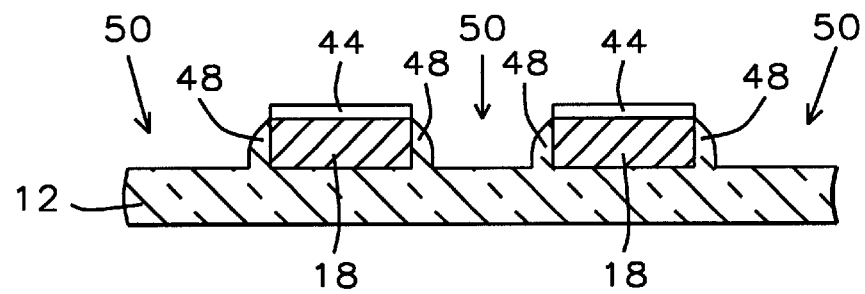

FIG. 10 shows the results of the etch that is applied to the layer 12 of IMD, this etch is an isotropic etch that produces the indicated sidewalls 48 of oxide that overlay the sides of the copper interconnect lines 18. The isotropic etch has an etch ratio that is greater than 5:1 between the stop layer 44 and the layer 12 of IMD, the etch ratio is preferably in the range between 5:1 and 20:1. The isotropic etch removes most of the IMD material 12 from between the pattern 18 of copper interconnect liens but leaves the sidewalls 48 of IMD material along these copper interconnect lines 18 essentially in place. The isotropic etch can be performed with dilute HF solution or a downstream fluorocarbon plasma. The etch in the HF solution is preferable for an etch time between about 5 and 10 minutes and more preferably for an etch time of about 8 minutes.

Figure 11:
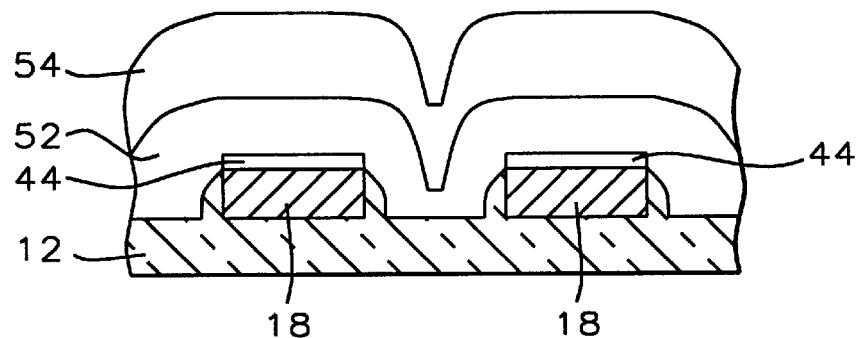

The essence of this etch is to observe that the continuous surface of the layer 12 of IMD that existed before the etch is removed by creating openings 50 in the surface of the layer 12 of IMD. These openings 50 can now be used for the deposition of the passivation layer. The results of this deposition is shown in FIG. 11 where a layer 52 of silicon nitride has been deposited inside openings 50 (FIG. 10) and overlying the remnants of the stop layer 44. Over layer 52 a layer 54 of silicon nitride is deposited completing the deposition of the passivation layer 52/54. It is again clear from the cross section that is shown in FIG. 11 that the layer of passivation is intertwined with the underlying layer 12 of IMD thereby eliminating flat, highly planarized surfaces between the surface of the layer 12 of IMD and the overlying layer of passivation. The cause for stress in the passivation layer and the thereby caused peeling of the passivation layer has in this manner been removed by the third embodiment of the invention.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method for forming a passivation film for an integrated circuit, the method comprising the steps of:

providing a semiconductor substrate whereby active components have been created in said substrate whereby furthermore copper interconnect lines are provided on the surface of said substrate that are imbedded in a layer of Intra Metal Dielectric (IMD);

etching said layer of IMD thereby creating openings in said layer of IMD that have essentially the cross section of a geometric square or rectangle whereby said openings created in said layer of IMD penetrate essentially down to a plane that is equal to the plane of said lower surface of said copper interconnect lines; and depositing a layer passivation film over the surface of said copper interconnect lines thereby including and filling with said passivation film said openings that have been created in said layer of IMD.

2. A method for forming a passivation film for an integrated circuit, the method comprising the steps of:

providing a semiconductor substrate whereby active components have been created in said substrate whereby furthermore copper interconnect lines are provided on the surface of said substrate said copper interconnect lines being separated by and imbedded in a layer of Intra Metal Dielectric (IMD);

depositing an etch stop layer over said upper surface of said copper interconnect lines thereby including the surface of said layer of IMD;

depositing a first passivation layer of over the surface of said stop layer of nitride;

etching said first passivation layer thereby creating openings in said first passivation layer whereby said openings in said first passivation layer have the profile of a geometric square or rectangle that overlay and are interstitial with said copper interconnect lines said openings that are created in said first layer of passivation to only partially penetrate through said first layer of passivation; and depositing a second layer of passivation film over the surface of said first layer of passivation thereby including and at least partially filling with said second passivation film said openings that have been created in said first layer of passivation.

3. The method of claim 2 wherein said first layer of passivation contains $SiO_x$.

4. The method of claim 2 wherein said second layer of passivation contains $Si_xN_y$.

5. A method for forming a passivation film for an integrated circuit, the method comprising the steps of:

providing a semiconductor substrate whereby active components have been created in said substrate whereby furthermore copper interconnect lines are provided on the surface of said substrate said copper interconnect lines being separated by and imbedded in a layer of Intra Metal Dielectric (IMD);

depositing an etch stop layer over the surface of said copper interconnect lines thereby including the surface of said layer of IMD;

patterning and etching said etch stop layer and said layer of IMD thereby creating openings in said stop layer and said layer of IMD by removing all of said stop layer together with an amount of said layer of IMD from regions of said stop layer and said layer of IMD that are interstitial with said copper interconnect lines thereby furthermore leaving a measurable amount of said IMD in place along the sidewalls of said copper interconnect lines;

depositing a first layer of passivation film over the surface of the remaining etch stop layer thereby including said openings that have been created in said layer of IMD; and depositing a second layer of passivation film over the surface of said first layer of passivation film.

6. The method of claim 5 wherein said first layer of passivation contains $SiO_x$.

7. The method of claim 5 wherein said second layer of passivation contains $Si_xN_y$.

8. A method for forming a $SiO_x/Si_xN_y$ passivation film for an integrated circuit, the method comprising the steps of:

providing a semiconductor substrate whereby active components have been created in said substrate whereby furthermore copper interconnect lines are provided on the surface of said substrate said copper interconnect lines having an upper and a lower surface in addition to having sidewalls said copper interconnect lines being separated by and imbedded in a layer of Intra Metal Dielectric (IMD) whereby furthermore the plane of said upper surface of said copper interconnect lines coincides with the plane of the top surface of said layer of IMD whereby furthermore a dark tone mask has been used for the creation of trenches in the layer of IMD into which the pattern of copper interconnect lines have been deposited;

etching said layer of IMD thereby creating openings in said layer of IMD by removing an amount of said layer of IMD from between said copper interconnect lines thereby furthermore leaving a measurable amount of said IMD in place between said copper interconnect lines whereby said openings that are created in said layer of IMD penetrate essentially down to a plane that is equal to the plane of said lower surface of said copper interconnect lines whereby said openings that are created in said layer of IMD are interstitial with and form the reverse pattern of said pattern of copper interconnect lines whereby furthermore the width of the cross section of said said openings that are created in said layer of IMD is smaller than the linear distance between said copper interconnect lines by a measurable amount whereby furthermore said openings that are created in said layer of IMD are centered between said pattern of copper interconnect lines; and depositing a layer of $SiO_x/Si_xN_y$ passivation film over the surface of said copper interconnect lines thereby including and filling with said $SiO_x/Si_xN_y$ passivation film said openings that have been created in said layer of IMD.

9. The method of claim 8 wherein said layer of Intra Metal Dielectric (IMD) is preferably formed of plasma oxide or LPCVD oxide material and specifically has a thickness of between 5000 and 15000 angstrom and more preferably about 15000 angstrom.

10. The method of claim 8 with the additional steps of forming a barrier layer and a seed layer over the surface of said trenches that have been created in said layer of IMD for the deposition of copper interconnect lines.

11. The method of claim 8 wherein said etching said layer of IMD applies photolithography and RIE procedures, using $CF_4/CHF_3$ as etchant gas.

12. The method of claim 8 wherein said depositing a layer $Si_xN_y$ uses LPCVD or PECVD procedures at a pressure between about 300 mTorr and 400 mTorr, at a temperature between about 600 and 800 degrees C., to a thickness of between about 2000 and 5000 Angstrom using $NH_3$ and $SiH_4$.

13. The method of claim 8 wherein said depositing a layer $Si_xN_y$ uses LPCVD or PECVD procedures using a reactant gas mixture such as dichlorosilane ($SiCl_2H_2$) as a silicon source material and ammonia ($NH_3$) as a nitrogen source, at a temperature between about 600 and 800 degrees C., at a pressure between about 300 mTorr and 400 mTorr, to a thickness between about 2000 and 5000 Angstrom.

14. The method of claim 8 wherein said depositing a layer of $SiO_x$ uses monosilane ($SiH_4$) and nitrous oxide ($N_2O$) as a source material deposited using LPCVD or PECVD procedures, at a temperature between about 300 and 800 degrees C., to a thickness between about 2000 and 5000 Angstrom.

15. A method for forming a $SiO_x/Si_xN_y$ passivation film for an integrated circuit, the method comprising the steps of:

providing a semiconductor substrate whereby active components have been created in said substrate whereby furthermore copper interconnect lines are provided on the surface of said substrate said copper interconnect lines having an upper and a lower surface in addition to having sidewalls said copper interconnect lines being separated by and imbedded in a layer of Intra Metal Dielectric (IMD) whereby furthermore the plane of said upper surface of said copper interconnect lines coincides with the plane of the top surface of said layer of ID whereby furthermore a dark tone mask has been used for the creation of trenches in the layer of IMD into which the pattern of copper interconnect lines have been deposited;

depositing an etch stop layer containing nitride over said upper surface of said copper interconnect lines thereby including the surface of said layer of IMD;

depositing a layer of $SiO_x$ over the surface of said stop layer of nitride;

etching said layer of $SiO_x$ thereby creating openings in said layer of $SiO_x$ by removing an amount of said layer of $SiO_x$ from regions of said layer of $SiO_x$ that overlay and are interstitial with said copper interconnect lines thereby furthermore leaving a measurable amount of said $SiO_x$ in place in regions of said layer of $SiO_x$ that overlay and are interstitial with said copper interconnect lines said openings that are created in said layer of $SiO_x$ to only partially penetrate through said layer of $SiO_x$ whereby furthermore the width of the cross section of said openings created in said layer of $SiO_x$ is smaller than the linear distance between said copper interconnect lines by a measurable amount whereby furthermore said openings created in said layer of $SiO_x$ are centered between said pattern of copper interconnect lines; and depositing a layer of $Si_xN_y$ passivation film over the surface of said layer of $SiO_x$ thereby including and at least partially filling with said $Si_xN_y$ passivation film said openings that have been created in said layer of $SiO_x$.

16. The method of claim 15 wherein said depositing an etch stop layer containing nitride is depositing a layer of silicon nitride ($Si_3Ni_4$) using LPCVD or PECVD procedures at a pressure between about 300 mTorr and 400 mTorr, at a temperature between about 600 and 800 degrees C., to a thickness of between about 200 and 500 Angstrom using $NH_3$ and $SiH_4$.

17. The method of claim 15 wherein said depositing an etch stop layer containing nitride applies LPCVD or PECVD procedures using a reactant gas mixture such as dichlorosilane ($SiCl_2H_2$) as a silicon source material and ammonia ($NH_3$) as a nitrogen source, at a temperature between about 600 and 800 degrees C., at a pressure between about 300 mTorr and 400 mTorr, to a thickness between about 200 and 500 Angstrom.

18. The method of claim 15 wherein said layer of $SiO_x$ contains monosilane ($SiH_4$) and nitrous oxide ($N_2O$) and is deposited using LPCVD or PECVD procedures, at a temperature between about 300 and 800 degrees C., to a thickness between about 1000 and 5000 Angstrom.

19. The method of claim 15 wherein said etching said layer of $SiO_x$ is performed via anisotropic RIE of said silicon oxide layer using $CHF_3$ or $CF_4$—$O_2$—He as an etchant.

20. The method of claim 15 wherein said depositing a layer $Si_xN_y$ uses LPCVD or PECVD procedures at a pressure between about 300 mTorr and 400 mTorr, at a temperature between about 600 and 800 degrees C., to a thickness of between about 2000 and 5000 Angstrom using $NH_3$ and $SiH_4$.

21. The method of claim 15 wherein said depositing a layer $Si_xN_y$ uses LPCVD or PECVD procedures using a reactant gas mixture such as dichlorosilane ($SiCl_2H_2$) as a silicon source material and ammonia ($NH_3$) as a nitrogen source, at a temperature between about 600 and 800 degrees C., at a pressure between about 300 mTorr and 400 mTorr, to a thickness between about 2000 and 5000 Angstrom.

22. A method for forming a $SiO_x/Si_xN_y$ passivation film for an integrated circuit, the method comprising the steps of:

providing a semiconductor substrate whereby active components have been created in said substrate whereby furthermore copper interconnect lines are provided on the surface of said substrate said copper interconnect lines being separated by and imbedded in a layer of Intra Metal Dielectric (IMD) whereby furthermore the plane of the top surface of said copper interconnect lines coincides with the plane of the top surface of said layer of ID;

depositing an etch stop layer containing nitride over the surface of said copper interconnect lines thereby including the surface of said layer of IMD;

patterning and etching said etch stop layer and said layer of IMD thereby creating openings in said stop layer and said layer of IMD by removing all of said stop layer together with an amount of said layer of IMD from regions of said stop layer and said layer of IMD that are interstitial with said copper interconnect lines thereby furthermore leaving a measurable amount of said IMD in place along the sidewalls of said copper interconnect lines whereby said openings that are created in said layer of IMD penetrate said layer of IMD to a depth that is essentially equal to the height of said sidewalls of said copper interconnect lines whereby furthermore said openings that are created in said layer of IMD are essentially centered between said pattern of copper interconnect lines; depositing a layer of $SiO_x$ passivation film over the surface of the remaining etch stop layer thereby including said openings that have been created in said layer of IMD thereby at least partially filling said openings that have been created in said layer of IMD with said $SiO_x$ passivation film; and depositing a layer of $Si_xN_y$ passivation film over the surface of said layer of $SiO_x$ passivation film.

23. The method of claim 22 wherein said depositing an etch stop layer containing nitride applies LPCVD or PECVD procedures using a reactant gas mixture such as dichlorosilane ($SiCl_2H_2$) as a silicon source material and ammonia ($NH_3$) as a nitrogen source, at a temperature between about 600 and 800 degrees C., at a pressure between about 300 mTorr and 400 mTorr, to a thickness between about 200 and 500 Angstrom.

24. The method of claim 22 wherein said etching said etch stop layer is a SiON or SiN removal process with etchant gasses $CH_3F/Ar/O_2$ at a temperature between about 10 and 20 degrees C., a pressure of between about 50 and 60 mTorr with an etch time of between about 40 and 60 seconds.

25. The method of claim 22 wherein said etching said etch stop layer is a wet etch using a buffered oxide etchant (BOE) whereby said BOE comprises a mixed solution of fluoro-ammonium and fluorohydrogen (7:1) and phosphoric acid solution.

26. The method of claim 22 wherein said etching said etch stop layer is uses anisotropic RIE using $CHF_3$ or $SF_6$—$O_2$ as an etchant.

27. The method of claim 22 wherein said depositing a layer $Si_xN_y$ uses LPCVD or PECVD procedures at a pressure between about 300 mTorr and 400 mTorr, at a temperature between about 600 and 800 degrees C., to a thickness of between about 2000 and 5000 Angstrom using $NH_3$ and $SiH_4$.

28. The method of claim 22 wherein said depositing a layer $Si_xN_y$ uses LPCVD or PECVD procedures using a reactant gas mixture such as dichlorosilane ($SiCl_2H_2$) as a silicon source material and ammonia ($NH_3$) as a nitrogen source, at a temperature between about 600 and 800 degrees C., at a pressure between about 300 mTorr and 400 mTorr, to a thickness between about 2000 and 5000 Angstrom.

29. The method of claim 22 wherein said etching said layer of IMD is an isotropic etch has an etch ratio that is greater than 5:1 between said stop layer and said layer of IMD with an the etch ratio that is preferably in the range between 5:1 and 20:1 said etch forming openings between said copper interconnect lines whereby said openings essentially penetrate as deep as the height of said copper interconnect lines whereby furthermore measurable amounts of IMD material remain in place along the sidewalls of said copper interconnect lines thereby forming sidewall oxide inside said openings.

30. The method of claim 22 wherein said layer of $SiO_x$ contains silane ($SiH_4$) and nitrous oxide ($N_2O$) and is deposited using LPCVD or PECVD procedures, at a temperature between about 300 and 800 degrees C., to a thickness between about 1000 and 5000 Angstrom.

* * * * *